United States Patent [19]

Curtis et al.

[11] Patent Number: 4,499,176

[45] Date of Patent: Feb. 12, 1985

[54] PHOTOPOLYMERIZABLE COMPOSITION FOR PRODUCING SCREEN PRINTING STENCILS

[75] Inventors: John R. Curtis, Salisbury; John D. Renwick, Ramsgate, both of England

[73] Assignee: Sericol Group Limited, London, England

[21] Appl. No.: 421,271

[22] Filed: Sep. 22, 1982

[30] Foreign Application Priority Data

Nov. 3, 1981 [GB] United Kingdom ............... 8133095

[51] Int. Cl.$^3$ .......................... G03C 7/12; G03C 1/71
[52] U.S. Cl. ................................... 430/253; 430/308; 430/281; 430/283; 430/285; 430/282; 430/909; 430/919; 430/911; 204/159.15; 204/159.22
[58] Field of Search ............... 430/283, 281, 282, 253, 430/308, 919, 284, 285, 909, 911; 204/159.22, 159.15

[56] References Cited

U.S. PATENT DOCUMENTS

| | | | |
|---|---|---|---|
| 3,510,303 | 5/1970 | Preddy et al. | 430/308 |
| 3,726,677 | 4/1973 | Hepher et al. | 430/308 X |
| 4,042,476 | 8/1977 | Collins et al. | 430/281 X |
| 4,043,819 | 8/1977 | Baumann | 430/283 |
| 4,118,233 | 10/1978 | Tsunoda et al. | 430/285 |
| 4,262,084 | 4/1981 | Kinney | 430/308 |

FOREIGN PATENT DOCUMENTS

| | | |
|---|---|---|
| 1351475 | 5/1974 | United Kingdom . |
| 1408466 | 10/1975 | United Kingdom . |
| 1426890 | 3/1976 | United Kingdom . |
| 1508315 | 4/1978 | United Kingdom . |
| 1571191 | 9/1980 | United Kingdom . |

*Primary Examiner*—John E. Kittle
*Assistant Examiner*—Cynthia Hamilton
*Attorney, Agent, or Firm*—Cushman, Darby & Cushman

[57] ABSTRACT

Aqueous compositions useful in making stencils for screen printing by the direct, indirect or direct/indirect method comprise a photopolymerizable monomer, a water-insoluble photoinitiator, a tertiary amine accelerator, a water-soluble colloid, water, and a water-miscible organic solvent.

17 Claims, No Drawings

PHOTOPOLYMERIZABLE COMPOSITION FOR PRODUCING SCREEN PRINTING STENCILS

DESCRIPTION

This invention relates to aqueous compositions for use in making stencils for screen printing.

In screen printing, two main photosensitive stencil systems are used. In the first, the so-called "indirect method", a photosensitive composition is coated onto a transparent polymeric backing support, usually of a polyester material. The coated support can be irradiated with actinic light through a positive transparency after which, depending on the type of photopolymerisation system used, the image obtained can be developed with water, or activated with a per-compound and then developed with water. The wet image on its polymeric backing support sheet is then adhered to the screen mesh by application of gentle even pressure, and, after drying, the polymeric support sheet is removed, leaving the photopolymerized image on the screen mesh ready for printing.

In the second system, the so-called "direct method", a stencil image is produced on a screen mesh by photosensitizing a water-soluble crosslinkable colloid with a suitable photocrosslinker which can be a dichromate compound or a polymeric diazonium salt, and then coating the colloid on to the screen mesh. When sensitized in this manner, the coated layer on the screen mesh, after drying, can be exposed to actinic light through a suitable positive transparency to produce a latent image. On development of the image with water, the areas irradiated by the actinic light remain as they have become insoluble in water, while the areas protected from the actinic light, which retain the original water-solubility of the water-soluble colloid, are washed away to leave an image which, after drying, is ready for printing.

Both the above methods of producing stencil images on a screen mesh have serious drawbacks. In the first method, when the system relies on photoinitiators of the ferric salt type, it has to undergo a treatment with a per-compound, e.g. hydrogen peroxide, to cause free radicals to be formed which initiate photopolymerisation of the monomers present to cause insolubilisation of the layer. After this activation step, normal water development follows to give the image.

The other method relies on a leuco sulphuric ester of an indigo or thio-indigo dye as the photoinitiator which requires the presence of moisture to remain active. This necessitates the use of quite large quantities of humectants in the formulation so that the material will function correctly in hot dry climates. These humectants create problems in high humidity areas and can cause reticulation of the film when it is removed from its sealed container. Their presence also tends to reduce the mechanical strength of the carrier colloid (usually polyvinyl alcohol), resulting in shorter print runs with the finished stencil.

The direct system suffers the drawback that the material is usually of a Two Pack variety which requires both a sensitizer and a base emulsion which on sensitizing has a useful pot life of a matter of days when the sensitizer is a dichromate and a maximum of three months when the sensitizer is a polymeric diazo salt.

Another disadvantage in the above methods for producing stencil images on a screen is that after exposure there is very little contrast between the exposed and unexposed areas so that there is no satisfactory way of inspecting the image before the development stage. This means that if the art work is faulty, or the positioning of the positive is incorrect, the fault goes unnoticed until after the final stencil image has been produced.

The present invention provides an aqueous photopolymerisable composition comprising a monomer containing terminal ethylenic unsaturation, a water-insoluble photoinitiator, an organic compound containing a tertiary amino group as accelerator, and a water-soluble colloid in a liquid medium comprising water and a water-miscible organic solvent or mixture thereof which dissolves the monomer the accelerator and the photoinitiator and does not cause precipitation of the colloid.

When used to produce indirect stencils, compositions based on this composition do not suffer the drawback of requiring an activation step with a solution of peroxide or equivalent substance or of having to contain quite large quantities of humectant. In the wet emulsion form, they do not require sensitization by a separate sensitizing component and hence offer the simplicity and convenience of a one pack system.

In a preferred embodiment of the invention the coating is coloured in such a way that after exposure there is an easily visible colour difference between the exposed and the non-exposed areas. The production of a visible and highly contrasted latent image immediately upon exposure to actinic light enables the stencil maker in the process of exposing a number of screen stencils at about the same time to know whether a given screen has been exposed or not. For instance, if his work is interrupted, or where a large single stencil screen is exposed a number of times, for example in the so-called 'step and repeat process' of preparing screen printing stencils, the operator is able to ascertain immediately which areas have been exposed. Also, where multiple exposures are required, the visible image of the first exposure may act as a guide for registration of subsequent exposures.

A photosensitive emulsion, applied to a screen mesh in any of the abovementioned methods, which is capable of producing a visible image upon exposure, prior to any subsequent development or treatment thereof, has also the advantage of vividly showing up screens that have been exposed by accident ("fogged" by exposure to stray sunlight or artificial light).

In the new compositions, a terminally ethylenically unsaturated monomer, or mixture of terminally ethylenically unsaturated monomers, is dissolved in a solvent which also dissolves the photoinitiator and accelerator and is compatible with the water-soluble colloid employed. The composition may also contain pigments or dyes to provide a visible image, inert fillers such as starch, kaolin, polytetrafluoroethylene, titanium dioxide or silica to increase the solids content of the formulation, prevent surface stickiness and promote slip, plasticizers to aid flexibility, and surfactants to improve stability and wetting.

The terminally ethylenically unsaturated monomer can be mono-, di- or tri-functional and can be an acrylate ester, acrylic amide, or vinyl amide. The preferred monomers are N-vinylpyrrolidone, acrylamide, methylene bis-acrylamide, triethylene glycol diacrylate, tetraethylene glycol diacrylate, polyethylene glycol 200 diacrylate, trimethylol propane triacrylate and pentaerythritol triacrylate. However, any terminally ethylenically unsaturated compound capable of being photopolymerized by actinic light of the appropriate wavelength when in contact with a suitable photoinitiator may be employed provided it is compatible with the system, and gives on photopolymerization a tough insoluble resin. Such monomers can be incorporated individually or in admixture and the mixture can be manipulated as regards its composition of mono-, di- and tri-functional compounds in order to produce the desired properties of speed, flexibility and durability in the coating. The proportion of monomer or monomers in the new compositions is normally 5 to 40% and preferably 8 to 30% by weight of the composition.

The photoinitiator is present in amount sufficient to promote an adequate rate of photopolymerization. Normally a concentration of 0.5 to 8% by weight of the composition, preferably 1 to 3% by weight, gives satisfactory results. The preferred photoinitiators are those which have absorptions above 325 mm and include thioxanthone derivatives, substituted benzophenones, and 1,1-methoxyacetophenone. However, any water-insoluble initiator that is soluble in the organic solvent or solvents used and is capable of forming free radicals on irradiation with actinic light of the appropriate wavelength can be used.

The solvent for the monomer and photoinitiator may be for example, N-methyl-pyrrolidone, dimethylsulphoxide, dimethylformamide, ethanol or ethylene glycol monomethyl ether. The solvent is generally 25 to 65%, and preferably 35 to 55% by weight of the composition.

Suitable accelerators or secondary initiators are organic compounds containing at least one tertiary nitrogen atom i.e. tertiary amino group, in which all three substituents on the nitrogen are preferably aliphatic. Especially preferred are accelerators which contain in addition to the tertiary amino group also at least one aliphatic alcohol function, or at least one terminally ethylenically unsaturated group which is preferably part of an ester or amide function. Compounds of the first type include methyl-diethanolamine, and of the second type include Uvecryl P101 (Uvecryl is a trade mark of UCB SA of Drogenbos, Belgium). Such accelerators may be used in a proportion of 0.1 to 8%, preferably 1 to 5%, by weight of the composition.

The water-soluble colloid may be, e.g. polyvinyl alcohol, polyvinyl pyrrolidone, hydroxyethyl cellulose, hydroxypropyl cellulose, or gelatin. Such colloids are not insolubilised in the presence of light by the photoinitiator alone.

The colloid may be, for example, 2 to 10%, preferably 4 to 7%, by weight of the composition, and the water 1 to 40%, preferably 15 to 35%, all the percentages being based on the total weight of the composition.

The preferred plasticisers (when such are used) are phthalate esters or glycol or glycerol esters. However, any plasticiser compatible with the system may be used. The proportion is generally less than 1% by weight of the composition.

The preferred fillers are starch, kaolin, polytetrafluoroethylene powder, titanium dioxide and silica, which are used to increase the overall solids contents of the composition, prevent surface stickiness and in some cases to promote slip. The proportion required is normally low, e.g. not more than 8%, and preferably 1 to 5%, by weight of the composition.

The photosensitive composition may also include dyes or pigments to render the final image visible. The initial coating can be coloured to provide visible images or the photopolymerised layer can be treated with a colouring solution after processing. In this connection it is especially preferred to include in the new compositions a thioindigoid or indigoid dyestuff, e.g. of the Anthrasol series (Hoechst). Such dyestuffs have the valuable property mentioned above that, in the presence of the free radical photoinitiator and a suitable water-soluble plasticiser for the water-soluble colloid, they change colour on exposure to actinic light to produce a clearly visible contrast between the light-struck and non-light-struck areas. Such dyestuffs have the additional advantage of acting as an additional photoinitiator (provided at least the dried composition contains sufficient moisture).

To improve their stability the new compositions may contain a surfactant, e.g. a non-ionic surfactant and especially a polyoxyethylenated alkyl-phenol.

In use the new compositions are coated on to a suitable support, e.g. a printing screen or a flexible transparent film, and then dried. The dry coating is exposed to actinic light to form the desired image, e.g. through a photographic transparency. The actinic radiation may be natural light or light derived from a carbon arc lamp, a xenon arc lamp, a high intensity mercury lamp, or a tungsten filament lamp. After exposure, the image is developed, e.g. by dissolution of unexposed parts of the coating in water.

The images formed by photopolymerisation of the new compositions can be used to prepare stencils for screen printing either by the direct or indirect method, or in any photographic or photomechanical process where resists, stencils or relief images are required, for example etching resists for printing plates, name plates, dials or circuit patterns, ink-accepting images for lithographic masters or negative stencils for positive reversal litho systems. The images can also serve as dye resists and printing matrices as well as visually coloured displays in reflective or transparent form.

The suitability of the image formed for a specific application is conditioned by the choice of the colloid and/or unsaturated monomer.

The following Examples illustrate the invention.

| EXAMPLE 1 | Weight |
| --- | --- |
| 13% aqueous polyvinyl alcohol solution (KP08)[1] | 40.0 g. |
| Polyethylene glycol 200 diacrylate | 8.0 |
| Uvecryl P101 (UCB)[2] | 8.0 |
| Ethanol | 24.0 |
| N—Methyl-pyrrolidone | 15.0 |
| Quantacure ITX[3] | 0.5 |
| Celacol M2500[4] | 1.0 |
| Cabosil M5[5] | 2.0 |
| 50% Colanyl Green GG (Hoechst) | 0.5 |

[1]KP08 is low viscosity polyvinyl alcohol with 25–29% residual acetate content from Nippon Gohsei of Osaka, Japan.
[2]Uvecryl P101 is a terminally ethylenically unsaturated compound containing at least one tertiary amino group per molecule manufactured by UCB SA.
[3]Quantacure ITX is 2-isopropyl-9H—thioxanthen-9-one (Ward Blenkinsop & Co. Ltd., Wembley, Middlesex, England).
[4]Celacol 2500 M is high viscosity methyl cellulose (British Celanese Ltd, Spondon, Derby, England).
[5]Cabosil M5 is amorphous fumed silica of nominal particle diameter 0.014 microns obtainable from K & K Greef Chemical Group Ltd, Croydon, Surrey, England.

This emulsion was coated on a 62TW screen mesh using a coating trough with 3 coats being given to each side of the mesh. After drying, the material was exposed through a film positive to a 800 watt mercury halide lamp at a distance of 1 meter for 300 seconds. After washing with cold water a relief stencil image was obtained.

| EXAMPLE 2 | Weight |
| --- | --- |
| Klucel H (Hercules Powder Co)[6] | 2.0 g. |
| Ethylene glycol monoethyl ether | 83.0 |
| 15% aqueous polyvinyl alcohol solution (KP08)[1] | 71.0 |
| Methylene bis-acrylamide | 6.0 |
| Polyethylene glycol 200 diacrylate | 13.5 |
| Trimethylol-propane triacrylate | 4.5 |
| Dimethylformamide | 40.0 |
| Benzil dimethyl ketal | 4.0 |
| Cabosil M5[5] | 7.0 |
| N—Methyl-diethanolamine | 6.0 |
| Anthrasol Grey 1BL (Hoechst) | 2.0 |

[6]Klucel H is high viscosity grade hydroxypropylcellulose from Hercules Inc, Wilmington, Delaware, U.S.A.

The above emulsion was coated on a 110 HDA (Heavy duty Amber) screen mesh applying 3 coats to each side of the mesh. After drying, the material was exposed through a film positive transparency to a 800 watt mercury halide lamp at a distance of 1 meter for 210 seconds. The latent image appeared colourless against a green-grey background. After washing with water a relief stencil image was obtained.

EXAMPLE 3

The same emulsion as that described in Example 1 was prepared except that the Colanyl Green GG was replaced by Anthrasol Blue Black 1RD (Hoechst) 1.0 After coating, drying, and exposure as described in Example 1, the latent image appeared cream-coloured on a grey-black background. After washing with cold water, a relief stencil image was obtained.

We claim:

1. An aqueous photopolymerizable composition comprising 5 to 40% by weight of the composition of a monomer containing terminal ethylenic unsaturation, 0.5 to 8% by weight of the composition of a water-insoluble photoinitiator, 0.1 to 8% by weight of the composition of an organic compound containing a tertiary amino group as accelerator, and 4 to 7% by weight of a water-soluble colloid in a liquid medium comprising 1 to 40% by weight of the composition of water and 25 to 65% by weight of the composition of a water-miscible organic solvent or mixture thereof which dissolves the monomer the accelerator and the photo-initiator and does not cause precipitation of the colloid.

2. A composition according to claim 1 wherein the said monomer is N-vinyl-pyrrolidone, acrylamide, triethylene glycol diacrylate, tetraethylene glycol diacrylate, polyethylene glycol 200 diacrylate, methylene bis-acrylamide, tripropylene glycol diacrylate, trimethylolpropane triacrylate, or pentaerythritol triacrylate.

3. A composition according to claim 1 in which the said monomer is present in a proportion of 8 to 30% by weight of the composition.

4. A composition according to claim 1 wherein the said water-miscible organic solvent is N-methyl-pyrrolidone, dimethylsulphoxide, dimethyl formamide, ethanol, ethylene glycol monomethyl ether, or a mixture thereof.

5. A composition according to claim 1 in which the said organic solvent is present in a proportion of 35 to 55% by weight of the composition.

6. A composition according to claim 1 in which the proportion of the photoinitiator is 1 to 3% by weight of the composition.

7. A composition according to claim 1 in which the accelerator is a terminally ethylenically unsaturated monomer containing at least one tertiary amino group, or a compound containing a tertiary amino group and at least one aliphatic alcohol function.

8. A composition according to claim 1 in which the proportion of the accelerator is 1 to 5% by weight of the composition.

9. A composition according to claim 1 wherein the water-soluble colloid is polyvinyl alcohol, polyvinyl pyrrolidone, hydroxyethyl cellulose, hydroxypropyl cellulose or gelatin.

10. A composition according to claim 1 in which the proportions are 15 to 35% by weight of water, based on the total weight of the composition.

11. A composition according to claim 1 which also contains a surfactant.

12. A composition according to claim 11 wherein the surfactant is a polyoxethylenated alkyl-phenol.

13. A composition according to claim 1 which also contains a plasticizer, filler and/or a colorant.

14. A composition according to claim 13 which contains a thioindigoid or indigoid dyestuff.

15. A support sheet coated with an aqueous photopolymerizable composition comprising 5 to 40% by weight of the composition of a monomer containing terminal ethylenic unsaturation, 0.5 to 8% by weight of the composition of a water-insoluble photoinitiator, 0.1 to 8% by weight of the composition of an organic compound containing a tertiary amino group as accelerator, and 4 to 7% by weight of a water-soluble colloid in a liquid medium comprising 1 to 40% by weight of the composition of water and 25 to 65% by weight of the composition of a water-miscible organic solvent or mixture thereof which dissolves the monomer the accelerator and the photoinitiator and does not cause precipitation of the colloid.

16. A support sheet according to claim 15 which is transparent and flexible.

17. A method of producing a stencil for screen printing which comprises irradiating a coated sheet as claimed in claim 15 with actinic light, developing the irradiated sheet, and transferring the insolubilized image to a screen.

* * * * *